US009276380B2

(12) United States Patent
Cheng et al.

(10) Patent No.: US 9,276,380 B2
(45) Date of Patent: Mar. 1, 2016

(54) SPONTANEOUS AND STIMULATED EMISSION CONTROL USING QUANTUM-STRUCTURE LATTICE ARRAYS

(71) Applicants: Keh-Yung Cheng, Champaign, IL (US); Chien-Chia Cheng, Xiluo Township (TW); Kuang-Chien Hsieh, Champaign, IL (US)

(72) Inventors: Keh-Yung Cheng, Champaign, IL (US); Chien-Chia Cheng, Xiluo Township (TW); Kuang-Chien Hsieh, Champaign, IL (US)

( * ) Notice: Subject to any disclaimer, the term of this patent is extended or adjusted under 35 U.S.C. 154(b) by 0 days.

(21) Appl. No.: 13/632,077

(22) Filed: Sep. 30, 2012

(65) Prior Publication Data

US 2013/0230069 A1    Sep. 5, 2013

Related U.S. Application Data

(60) Provisional application No. 61/542,268, filed on Oct. 2, 2011.

(51) Int. Cl.
| | |
|---|---|
| H01S 5/34 | (2006.01) |
| H01L 33/04 | (2010.01) |
| H01L 33/06 | (2010.01) |
| H01S 5/10 | (2006.01) |
| B82Y 20/00 | (2011.01) |
| H01S 5/12 | (2006.01) |
| B82Y 40/00 | (2011.01) |

(52) U.S. Cl.
CPC . *H01S 5/34* (2013.01); *B82Y 20/00* (2013.01); *H01L 33/04* (2013.01); *H01L 33/06* (2013.01); *H01S 5/105* (2013.01); *H01S 5/1078* (2013.01); *B82Y 40/00* (2013.01); *H01L 2933/0083* (2013.01); *H01S 5/1228* (2013.01); *H01S 5/3412* (2013.01)

(58) Field of Classification Search
CPC ...... B82Y 40/00; H01L 29/127; H01L 33/06; H01L 33/10; H01L 31/035236; H01L 33/04; H01S 5/3412; H01S 5/34
USPC ...................... 257/13, 14, E33.008, E31.033, 257/E29.071; 438/22; 372/45.01
See application file for complete search history.

(56) References Cited

U.S. PATENT DOCUMENTS

2011/0037050 A1* 2/2011 Kim ................................ 257/13

* cited by examiner

*Primary Examiner* — Whitney T Moore (57) ABSTRACT

A device for controlling light emissions and a method for fabricating the device are disclosed herein. A quantum well of an active region of a semiconductor device may comprise a quantum structure lattice having lattice geometries that satisfies the Bragg condition, such that inter-quantum structure distance d between a first quantum structure and a second quantum structure within the quantum structure lattice is an integer multiple of a emission half wavelength $m\lambda_o/2n$, where m is an integer, $\lambda_o$ is a wavelength in free space, and n is a refractive index of a cladding material of the quantum well.

21 Claims, 6 Drawing Sheets

SPONTANEOUS AND STIMULATED EMISSION CONTROL USING QUANTUM-STRUCTURE LATTICE ARRAYS

This application claims priority from U.S. Provisional Patent Application Ser. No. 61/542,268 filed Oct. 2, 2011, the entire contents of which is incorporated herein by reference.

GOVERNMENT RIGHTS

This disclosure was made with Government support under grant no W911NF-09-1-0490 awarded by the U.S. Army Research Office. The Government may have certain rights in this disclosure.

BACKGROUND

Aspects of the present disclosure generally relates to semiconductor devices, and more specifically relates to using a quantum-structure lattice array to control the light emission properties of a semiconductor quantum well structure.

Spontaneous and stimulated optical emissions properties of semiconductor active regions may predominately control the performance of optoelectronic emitters such as lasers, light-emitting diodes (LEDs), and single-photon emitters. Such spontaneous emissions properties may be controlled by the environment surrounding the light emitter. For example, optical microcavities in the form of photonic crystals, distributed Bragg reflectors (DBRs), distributed feedback structures (DFBs), and optical waveguides have all been proposed as ways to enhance, attenuate, or suppress spontaneous emissions by changing the density of associated electromagnetic states.

Because passive microcavities does not emit light in of itself, quantum wells and quantum dots are often used as light emitters in the active region of microcavities. Such quantum wells and quantum dots may typically be used for emission wavelength selection via quantum size effects.

BRIEF SUMMARY

According to one aspect of the present disclosure, a quantum well of an active region of a semiconductor device comprises a quantum structure lattice having lattice geometries that satisfies a Bragg condition, such that inter-quantum structure distance d between a first quantum structure and a second quantum structure within the quantum structure lattice is an integer multiple of a emission half wavelength $m\lambda_o/2n$, where m is an integer, $\lambda_o$ is a wavelength in free space, and n is a refractive index of a cladding material of the quantum well.

According to another aspect of the present disclosure, a method for forming a semiconductor device comprises forming, within a quantum well of an active region of the semiconductor device, a quantum structure lattice having lattice geometries that satisfies a Bragg condition, such that inter-quantum structure distance d between a first quantum structure and a second quantum structure within the quantum structure lattice is an integer multiple of a emission half wavelength $m\lambda_o/2n$, where m is an integer, $\lambda_o$ is a wavelength in free space, and n is a refractive index of a cladding material of the quantum well.

These and other features, aspects and advantages of the present disclosure will become better understood with reference to the following drawings, description and claims.

DETAILED DESCRIPTION

The following detailed description is of the best currently contemplated modes of carrying out exemplary embodiments of the disclosure. The description is not to be taken in a limiting sense, but is made merely for the purpose of illustrating the general principles of the disclosure, since the scope of the disclosure is best defined by the appended claims.

Various inventive features are described below that can each be used independently of one another or in combination with other features.

Broadly, embodiments of the present disclosure generally provide a quantum-structure lattice (QSL) with in-plane two dimensional distributed feedback (DFB) that may be formed to control the light emission properties of a quantum well on a semiconductor device.

The QSL design may be used to extend the emission wavelength of light emitters, such as LEDs. Because the emission wavelength of light emitters may be controlled by the interaction between the quantum well natural wavelength and the Bragg condition offered by the QSL, the emission wavelength of light emitters may be tuned by selecting suitable lattice geometries for the QSL that satisfies the Bragg condition. The photoluminescence peak of QSLs may be controlled to blue-shift, red-shift, or remain unchanged from the peak wavelength of as-grown quantum wells through a phonon-assisted recombination process, thus offering the freedom of selecting the appropriate emission wavelength for applications where an appropriate emission wavelength differs from that of the quantum well (QW) emission wavelength.

The QSL design may also be used to shape light emission patterns of light emitters into a narrow angle to enhance the extraction efficiency of LEDs as well as to lower the threshold current of injection lasers. Such shaping of emission energy patterns into anisotropic patterns may be achieved via in-plane resonance due to the periodic structure of the QSL design.

The QSL design may also show a smaller temperature dependency of the spontaneous emission wavelength as compared to the QW emission wavelength.

In accordance with an embodiment of the present disclosure, a quantum-structure lattice in the quantum well of an active region of a semiconductor device may be a periodic one-dimensional or two-dimensional grating or lattice array of gain material in the form of relatively uniform (having a less than or equal to about 10% variation) quantum boxes, quantum wires, or quantum dots. The two-dimensional grating or lattice array of gain material may also form two-dimensional patterns of quantum structures, such as a square quantum box pattern or a triangular quantum box pattern. When the quantum-structure lattice is structured so that the periodicity of the active lattice elements is designed to be an integer multiplication of the half wavelength of the optical emission from each of the lattice elements, the constructive optical interaction due to Bragg scattering may effectively make the quantum-structure lattice a high-Q cavity with the ability to actively emit optical radiation having certain designed emission properties. The quantum-structure lattice may include quantum boxes used as active lattice units in the quantum structure lattice and arranged in the square arrays fabricated in strained InGaAs/GaAs quantum wells. The uniform quantum box arrays may provide Bragg diffractions from periodic perturbances of the gain medium of the quantum-structure lattice array. This structure may offer the possibility of forming two-dimensional distributed feedback (DFB) not relying on the perturbations of the refractive index.

Figure 1:
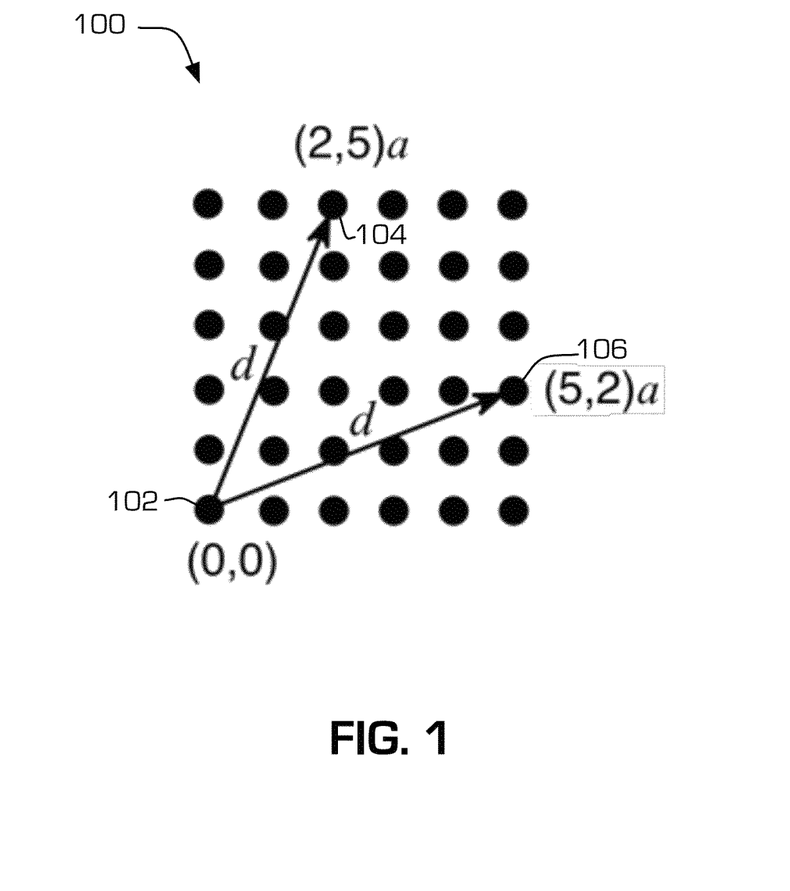
FIG. 1 shows a plan view of a quantum-structure lattice in accordance with an embodiment of the present disclosure.

With reference to FIG. 1 a quantum-structure lattice 100 may be a two-dimensional ordered in-plane arrangement of relatively uniformly sized (having a less than or equal to about 10% variation) and relatively uniformly spaced (having a less than or equal to about 10% variation) quantum structures, such as quantum box emitters or quantum dot emitters, where the nearest distance between the quantum structures, or the lattice constant, is a. In an exemplary embodiment, a may be 200 nm. Thus, for the quantum-structure lattice 100, the Bragg condition may be satisfied when an inter-quantum structure distance d becomes an integer multiple of the emission half wavelength $m\lambda_o/2n$, where m is an integer, $\lambda_o$ is the wavelength in free space, and n is the refractive index of the cladding material of the quantum well. For example, as shown in FIG. 1, two arbitrary inter-quantum structure distances d having the same length may link a quantum structure at the origin (0, 0) 102 to quantum structures at lattice points (2, 5)a 104 and (5, 2)a 106. When the Bragg condition is satisfied, so that d is an integer multiple of the emission half wavelength $m\lambda_o/2n$, photons emitted from one quantum structure emitter may constructively interfere with the nearest neighboring quantum structure emitters at distance d, and may then constructively interfere again with the next neighboring quantum structure emitters at distance 2 d, and so forth in a repetitive manner. The strong constructive optical interaction between neighboring quantum structure emitters that satisfy the Bragg condition may effectively make the entire quantum structure lattice 100 a high-Q active cavity in of itself in the lateral directions.

Figure 7:
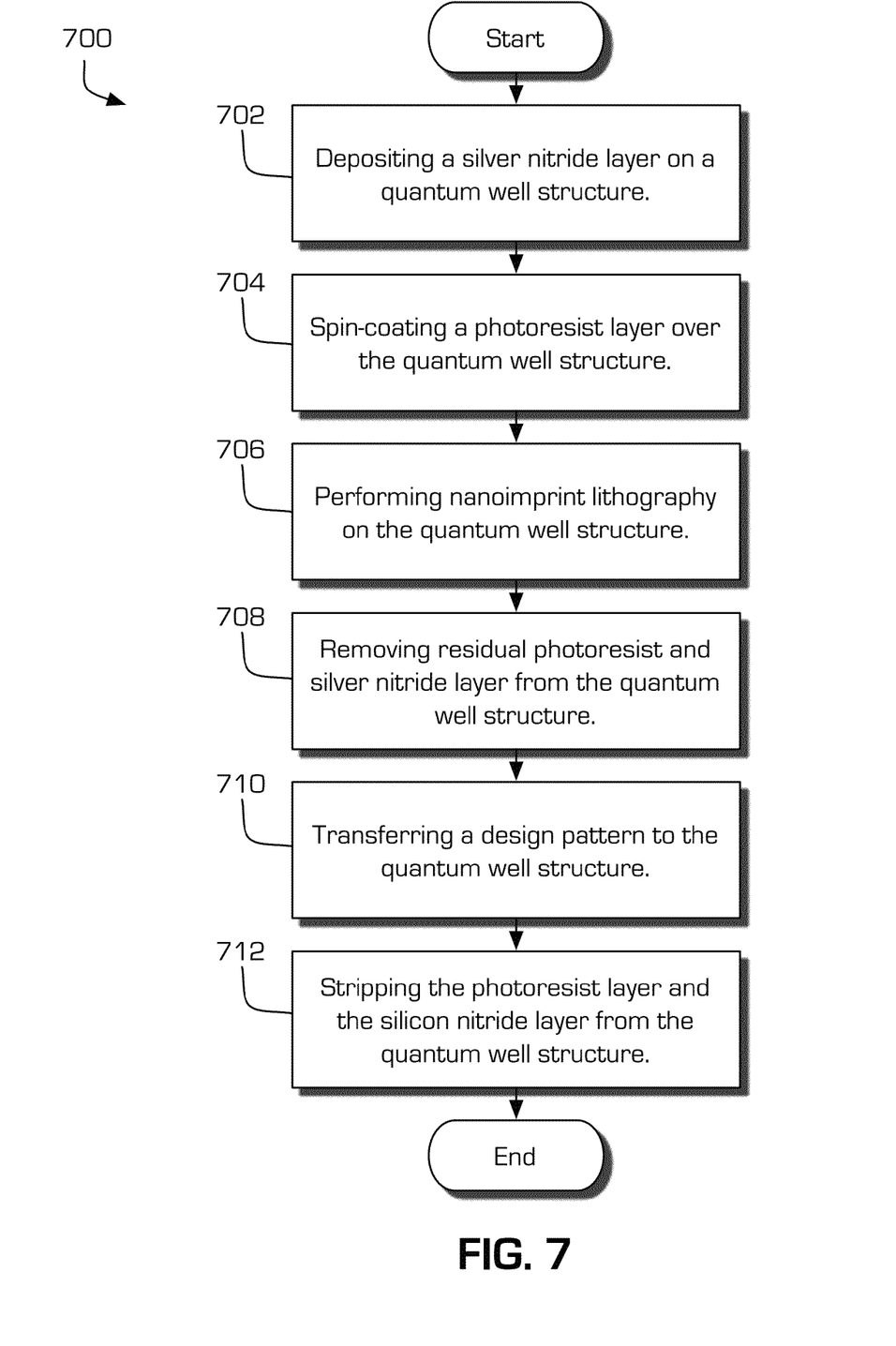
FIG. 7 shows a flowchart of a method of fabricating a quantum structure lattice in accordance with an embodiment of the present disclosure.

FIG. 7 illustrates a flowchart of a fabrication method 700 for fabricating a quantum structure lattice in accordance with an embodiment of the present disclosure. The fabrication method 700 is described below with further reference to several section views illustrating various fabrication stages.

FIGS. 2A-2H show phases of a method of fabricating a quantum structure lattice, such as a two-dimensional QSL in strained InGaAs/GaAs quantum well structure, in accordance with an embodiment of the present disclosure.

Figure 2A:
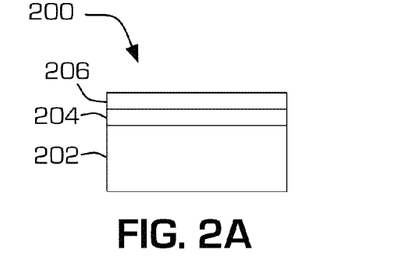
FIGS. 2A, 2B, 2C, 2D, 2E, 2F, 2G, and 2H show phases of a method of fabricating a quantum structure lattice in accordance with an embodiment of the present disclosure.

With reference to FIG. 2A, conventional epitaxial growth techniques, such as molecular beam epitaxy (MBE) and metalorganic chemical vapor deposition (MOCVD), may be used to fabricate a InGaAs quantum well structure 200 with a thickness and composition that correspond to a designed wavelength. As shown in FIG. 2A, the quantum well structure 200 may comprise a GaAs substrate 202, such as a 400 nm GaAs buffer layer, an InGaAs strained quantum well 204 disposed above the substrate 202, and a GaAs cap layer 206, such as a 15 nm GaAs cap layer, disposed above the quantum well 204. The substrate 202, quantum well 204, and cap layer 206 may be undoped with background doping levels below $10^{15}$ cm$^{-3}$.

Figure 2B:
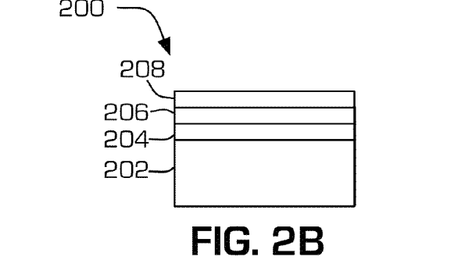

FIG. 2B illustrates a silicon nitride deposition phase of fabricating the quantum structure lattice. At step 702 of the fabrication method 700, a thin silicon nitride layer 208 or dielectric layer may be deposited on the quantum well structure 200 above the GaAs cap layer 206.

Figure 2C:
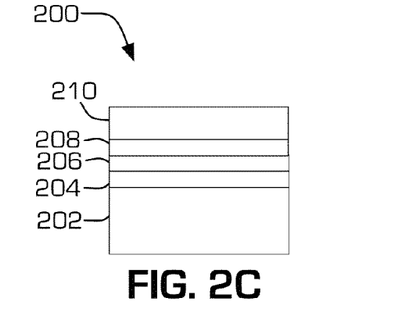

FIG. 2C illustrates a photoresist coating phase of fabricating the quantum structure lattice. At step 704 of the fabrication method 700, a layer of ultraviolet-curable photoresist (PR) 210 may be spin-coated over the quantum well structure 200 above the thin silicon nitride layer 208.

Figure 2D:
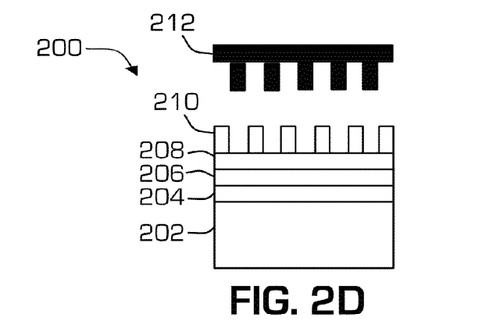

FIG. 2D illustrates a lithography phase of fabricating the quantum structure lattice. At step 706 of the fabrication method 700, soft nanoimprint lithography may be performed by impressing a polydimethylsiloxane (PDMS) mold 212 into the photoresist layer 210, exposing the structure 200 to ultraviolet light, and separating the PDMS mold 212 from the structure 200. Alternatively, electron beam exposure/writing may be performed instead of soft nanoimprint lithography.

The mold 212 may impress a designed pattern, such as a perpendicular crossbar array having 100×100 nm$^2$ openings on a 200 nm pitch that yields an array density of $2.5 \times 10^9$ cm$^{-2}$, with the average diameter of the mold 212 for pillar etchings being about 80 nm.

Figure 2E:
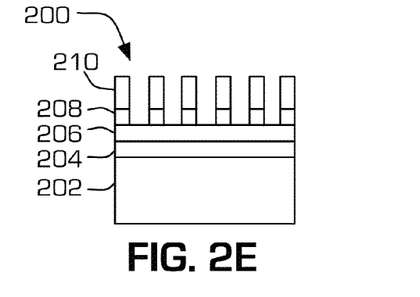

FIG. 2E illustrates a residue removal phase of the quantum structure lattice. At step 708 of the fabrication method 700, residual photoresist within the photoresist layer 210 as well as the underlying silicon nitride layer 208 may be removed, such as via reactive ion etching (RIE) using oxygen and Freon gases.

Figure 2F:
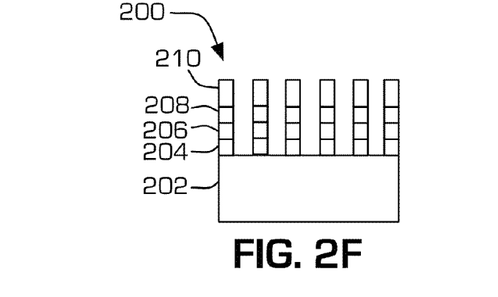

FIG. 2F illustrates a design transfer phase of fabricating the quantum structure lattice. At step 710 of the fabrication method 700, the design pattern may be transferred to the structure 200 by wet etching, which may include using a solution of ammonium, hydrogen peroxide, and a deionized water mixture. The design pattern transferred to the structure may, for example, be the quantum-structure lattice 100 shown in FIG. 1.

Alternatively, instead of wet etching, the design pattern may be transferred to the structure via ion implantation or ion diffusion together with an impurity-induced layer disordering process.

Figure 2G:
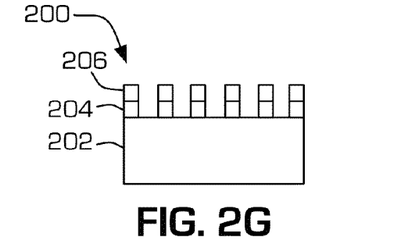

FIG. 2G illustrates a stripping phase of fabricating the quantum structure lattice. At step 712 of the fabrication method 700, the photoresist layer 210 and the silicon nitride layer 208 may be stripped using hydrofluoric acid under ultrasonic agitation in order to reveal the now-formed quantum lattice structure.

Figure 2H:
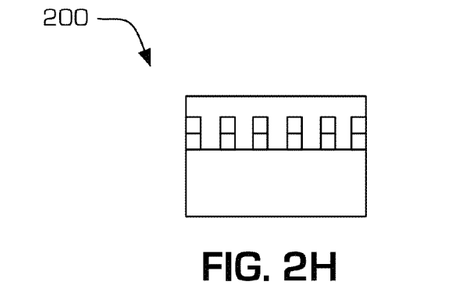

FIG. 2H illustrates a regrowth phase of fabricating the quantum structure lattice, the finished quantum lattice structure may be subject to an epitaxial regrowth to planarize the structure as well as to provide lateral quantum confinement for the quantum boxes-within the finished quantum structure lattice.

It should be understood that the above-described method discloses one of many embodiments for forming quantum structure lattices, and that quantum structure lattices may also be formed by any other known method.

Further, in addition to GaAs substrates (including InGaAs, InGaP, AlGaAs, GaInAlP, and GaAsP systems), quantum structure lattices may also be formed on InP substrates (including GaInAsP, AlGaInAs, and AlGaInSb systems), GaN-based systems (AlGaInN grown on sapphire, on SiC, on GaN, and on Si), and Si system (SiGe on Si), as well as any other known systems.

The spontaneous emission properties of the QSL as compared with as-grown quantum well samples may be characterized using PL measurements. The QSL and as-grown quantum well samples may be measured at room temperature or at 77 kelvin (K) in a liquid nitrogen-cooled cryostat, and the samples may be excited using a frequency-doubled yttrium aluminum garnet (YAG) laser source with a wavelength of 532 nm. The signal may be detected by a liquid nitrogen-cooled germanium photodetector in a 0.5-meter spectrometer with a lock-in amplifier.

Figure 3:
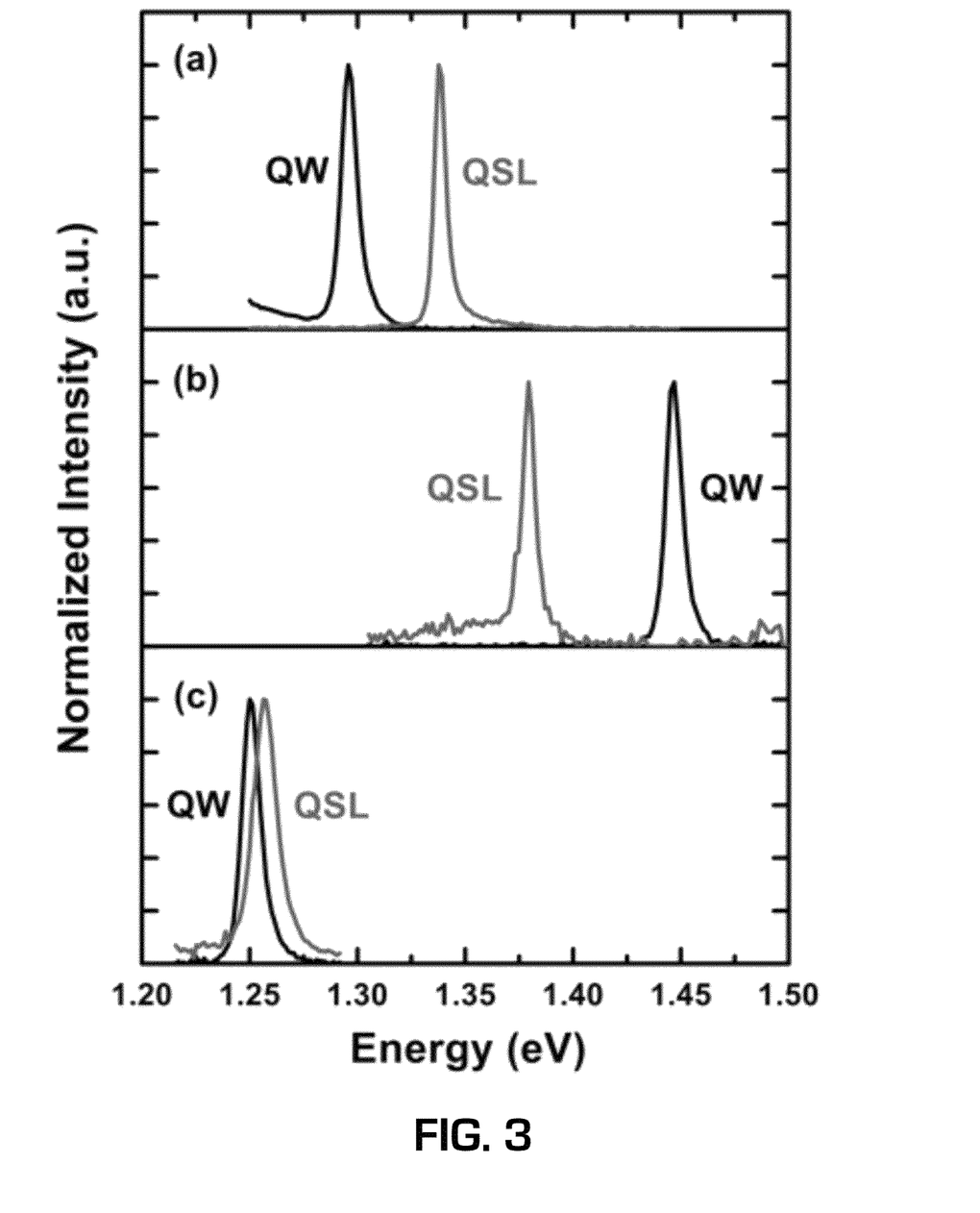
FIG. 3 shows graphs of the photoluminescence (PL) spectra of quantum-structure lattice samples as compared to as-grown quantum well samples fabricated from the same material in accordance with an embodiment of the present disclosure.

Graph (a) of FIG. 3 shows a normalized 77K PL spectra of a 10 nanometer $In_{0.18}Ga_{0.82}As/GaAs$ strained quantum well sample (Sample A) as compared with a quantum structure lattice array sample fabricated from the same material. As shown in graph (a), the QSL sample may be designed so that its PL peak is blue-shifted by about 39 millielectron volt (meV) from that of the natural wavelength of the QW sample while maintaining a narrow (about 8 meV) full-width at half-maximum (FWHM).

The averaged diameter of the quantum boxes may be about 38 nm. The 77 K PL spectrum of the QSL array shows a peak centered at 1.318 eV, which is a 30 meV blue-shift from that of the as-grown QW sample (1.348 eV). In this QSL sample, the spontaneous emission may involve both electron-hole recombination and phonon absorption recombination processes. Both the QSL sample and the original QW show a narrow PL spectrum with a full-width at half maximum (FWHM) ~8 meV indicating the emission wavelengths from all QBs in the QSL array may be nearly identical. The spontaneous emission wavelength of the QSL may be determined by fulfilling the in-plane Bragg diffraction condition with the phonon-assisted QB emissions. Due to the proximity of QBs to the sample surface (≤25 nm), the effective periodic refractive index change near the surface may be quite small and a complete photonic bandgap will not be formed. In PhC structures, on the other hand, significant periodic index change ($\Delta \bar{n} \geq 0.21\bar{n}$) of photonic lattice points is necessary for light emission modification. For example, light-emitting diodes (LEDs) with 100~200 nm thick air-hole PhC surface structures above the active layer were used to improve the light extraction efficiency of the LED. To further clarify this difference, the fabricated QSL array was cleaned and loaded into the MBE system again for regrowth. After an in-situ surface clean using atomic hydrogen, a 50 nm GaAs was regrown over the whole structure such that the active QB region of the QSL array was completely embedded in GaAs and the small effective periodic index change between semiconductor and air in the QB plane was removed. In addition, except the differences in PL intensity and a ~2 meV blue-shift in peak position, the PL spectra from the 77 K PL spectra of the QSL array before and after the regrowth of a GaAs cap layer may be nearly identical. Therefore, unlike the PhC case where the periodic refractive index change plays the major role, the spontaneous emission of the QSL array may be selected by fitting the QB emissions with the 2D Bragg diffraction of the 2D array.

Since the average diameter of etched pillars containing InGaAs quantum boxes may be about 38 nm, the in-plane quantum size effect should not contribute significantly to the large blue shift of the measured PL spectrum of the quantum structure lattice array sample. In this case, the calculated integer m that fulfills the Bragg condition may be 8, and the nearest resonant neighbors may be located at $(\pm 2, \pm 5)a$ and $(\pm 5, \pm 2)a$ of the QSL from the origin.

Graph (b) of FIG. 3 shows a normalized 77K PL spectra of a 7.5 nm $In_{0.075}Ga_{0.925}As/GaAs$ strained quantum well sample (Sample B) as compared with a quantum structure lattice array sample having an average quantum box diameter of about 29 nm that is fabricated from the same material. As shown in graph (b), the QSL sample may be designed so that its PL peak is red-shifted by about 65 meV from that of the QW sample while maintaining a narrow (about 7 meV) FWHM. In this case, the calculated integer m that fulfills the Bragg condition may be 5, and the nearest resonant neighbors may be located at $(\pm 1, \pm 3)a$ and $(\pm 3, \pm 1)a$ of the QSL from the origin.

Graph (c) of FIG. 3 shows a normalized 77K PL spectra of a 10 nm $In_{0.22}Ga_{0.78}As/GaAs$ strained quantum well sample (Sample C) as compared with a quantum structure lattice array sample having an average quantum box diameter of about 50 nm that is fabricated from the same material. The QSL sample was designed to have the same spontaneous emission PL peak position as the as-grown QW sample with a designed QSL emission wavelength of about 1.26 eV. In this case, the calculated integer m that fulfills the Bragg condition may be 2, and the nearest resonant neighbors may be located at $(\pm 1, \pm 1)a$ of the QSL from the origin. The PL peak of the QSL sample is nearly identical to the PL peak of the QW sample with only a 6 meV blue-shift, which may be explained by the deviation of the PL wavelength of the as-grown QW sample from the designed value and the refractive index value used.

Figure 4A:
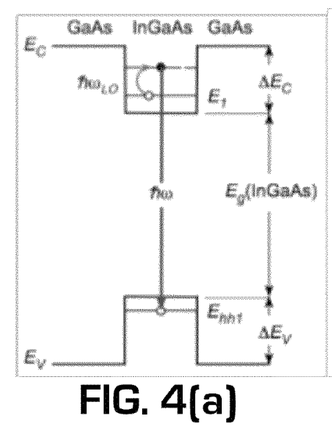
FIGS. 4(a), 4(b), and 4(c) show the quantum well energy band structures of quantum structure lattices in accordance with an embodiment of the present disclosure.

Further insight of the spontaneous emissions behavior of QSLs may be gained by comparing the energy band structures of various QSLs. FIG. 4(a) shows the QW energy band structure of a QSL fabricated from a 10 nm $In_{0.18}Ga_{0.82}As/GaAs$ strained QW (Sample A from above). The composition ($x_{InAs}$) and thickness (z) of the strained InGaAs QW were determined from double-crystal x-ray diffraction (DCXD) rocking curves as 0.184 and 9.9 nm, respectively. Base on these material parameters, the calculated allowed QW transition energy ($E_1g\ E_{hh1}$) is 1.289 eV. The measured ground state transition energy is very close to the calculated value using measured material parameters. In comparison with the measured spontaneous emission wavelength of the QSL of 1.335 eV, the QSL emission is 39 meV (about one phonon-energy, $\Delta E = \hbar \omega_{LO}(GaAs) \approx 0.036$ eV) above the QW transition energy.

Figure 4B:
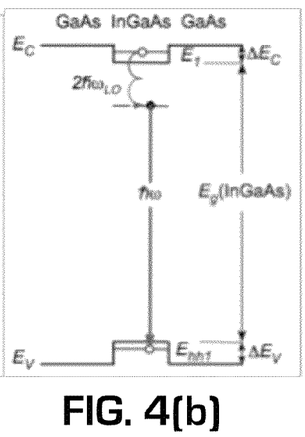

FIG. 4(b) shows the QW energy band structure of a QSL fabricated from a 7.5 nm $In_{0.075}Ga_{0.925}As/GaAs$ strained QW structure (Sample B from above). In Sample B, the conduction band discontinuity $\Delta E_C=24$ meV may be smaller than that of sample A ($\Delta E_C=95$ meV), such that the ground state in the Sample B QW is very close to the conduction band edge of GaAs barriers. Using the material parameters determined by DCXD rocking curves, i.e., $x_{InAs}=0.074$ and $\approx=7.8$ nm, the derived Sample B QW ground state transition energy may be the same as the measured value of 1.447 eV. The measured spontaneous emission wavelength of the Sample B QSL is 1.382 eV, which is 65 meV (about two phonon energy, $\Delta E = 2\hbar \omega_{LO}(GaAs) \approx 0.072$ eV) below the Sample B QW ground state transition energy. Therefore, the spontaneous emission of a QSL array involves not only electron-hole recombination but also phonon absorption/emission.

Phonon-assisted absorptions may be common in indirect band gap semiconductors, and phonon-assisted laser operation $\hbar \omega_{LO}$ below the confined QW transition energy have been demonstrated in InGaAs/GaAs/AlGaAs QW heterostructures. By tuning the photon lifetime through cavity reflectivity adjustment, QW lasers may be operated via band-to-band recombination and/or phonon-assisted recombination. Since cavity resonance contribution is minimal in spontaneous emission processes, phonon-assisted spontaneous emission has not been observed.

However, in accordance with embodiments of the present disclosure, phonon-assisted spontaneous emission may clearly be displayed in QSL arrays embedded with a 2D QB emitter array (an in-plane resonant cavity) in the active region. The periodic arrangement of QB emitters may allow the fulfillment of in-plane Bragg diffraction conditions of the QSL by many wavelengths and along different in-plane directions. Under the photo-excitation, the PL wavelength of the QSL may be determined by either the original QW emission energy or the QW emission energy assisted by phonon emission or absorption, provided that the PL spectral of the QSL is narrow. If the periodic QB emitters have a wide spread of spontaneous emission wavelengths, such as in site-controlled quantum dots (SCQDs), only a limited number of wavelengths can match the same Bragg condition, then the phonon-assisted spontaneous emission may not be observed.

Figure 4C:
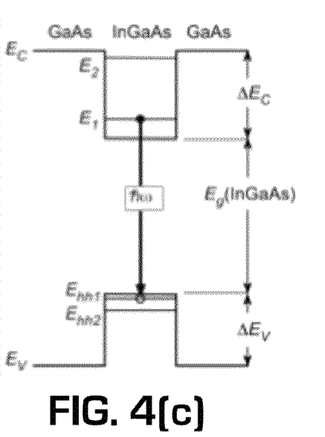

FIG. 4(c) shows the QW energy band structure of a QSL fabricated from a 10 nm $In_{0.22}Ga_{0.78}As/GaAs$ strained quantum well structure (Sample C from above). In QSL arrays, when $\Delta E_C$ of the QW is much greater than the phonon energy, as in Samples A and C ($\Delta E_C$=123 eV), the spontaneous emission of the QSL array can take two forms: It can oscillate at the QW emission wavelength as shown in FIG. 4(c) (Sample C), or the electron in the conduction band can absorb a phonon before recombining with a hole in the valence band, as shown in FIG. 4(a) (Sample A), leading to a blue-shift in emission wavelength relative to the QW emission. When $\Delta E_C$ of the QW is small and the ground state of the QW is less than the phonon energy below the energy barrier, phonon emission accompanying with the QW transition may take place. This process may produce a red-shift of the QSL emission wavelength as shown in FIG. 4(b), where two phonons may be emitted in the QW transition process.

The origin of the spontaneous emission properties from a QSL may be further revealed from the temperature dependency of its emission peak wavelength. In commonly used DFB structures, the active region and the grating are located in adjacent regions. The temperature-dependent spontaneous emission peak wavelength may, therefore, not determined by the grating structure due to the finite coupling of the optical field with the grating. The temperature shift of the bandgap energy of the active region may still dominate the spontaneous emission peak wavelength. Only under the stimulated emission condition, due to the strong interaction with the grating structure, may the DFB emission follow the temperature shift of the grating. In the QSL array case, the 2D QB array may act as both light emitters as well as a 2D grating ensuring a maximum coupling between the active light emitters and the grating structure. Thus, the QB spacing may play a major role in determining the temperature-dependent spontaneous emission wavelength of a QSL array. Thus, the emission peak wavelength of a QSL may predominately be determined by the Bragg condition of the 2D QB array and its temperature dependency of the diffractive index of the QW as in a DFB structure. Therefore the shift of the emission peak wavelength of a QSL may be much less sensitive than a QW structure as the surrounding temperature varies.

Figure 5:
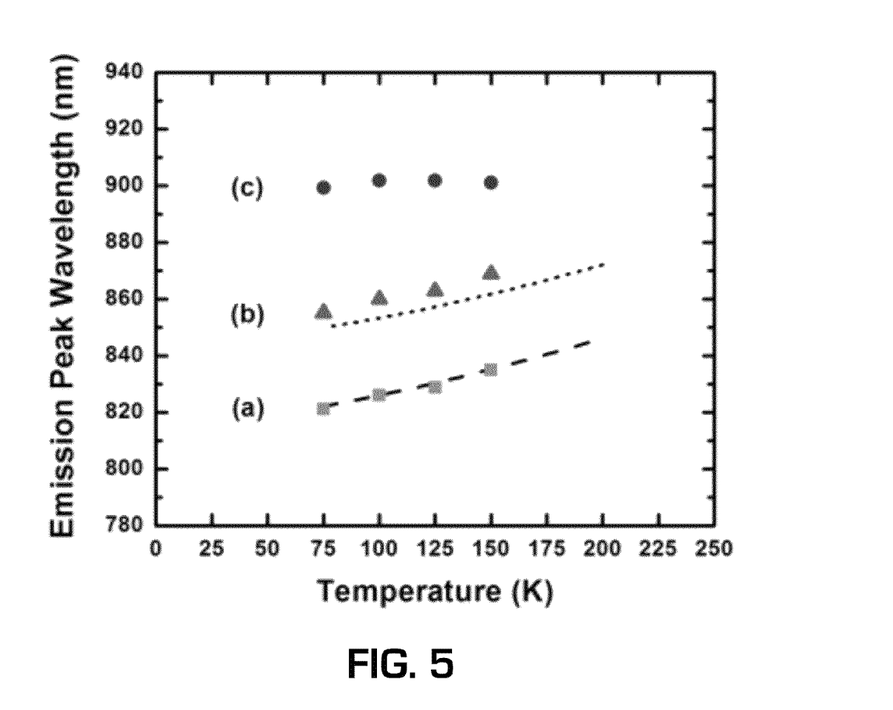
FIG. 5 shows a graph of the temperature dependency of the spontaneous emission wavelengths of quantum structure lattice samples in accordance with an embodiment of the present disclosure.

FIG. 5 shows the temperature dependency of the spontaneous emission wavelength of QSL Samples A, B, and C, as discussed above. As shown in FIG. 5, the temperature dependency of the spontaneous emission wavelength of a QSL similar to the Sample B discussed above, at between 77 and 150 K, may be 0.024 nm/K. In comparison, the temperature dependency of the emission wavelength from a InGaAs/GaAs QW structure may only follow band-gap energy variation. In the same temperature range, the emission wavelength of the reference InGaAs QW structure may change at a rate of 0.177 nm/K, which follows the bandgap energy variation and is more than 7 times larger than that of the QSL array.

In addition to spontaneous emission wavelength control, the radiation patterns emanating from a QSL array may be manipulated without the use of an external microcavity, as in a PhC structure. Because each periodically distributed quantum box emitter in a QSL array may act as an electromagnetic radiation source, an entire QSL array can be seen as a planar one or two-dimensional antenna array having a radiation beam shape that may be controlled by the design of the QSL structure.

Figure 6:
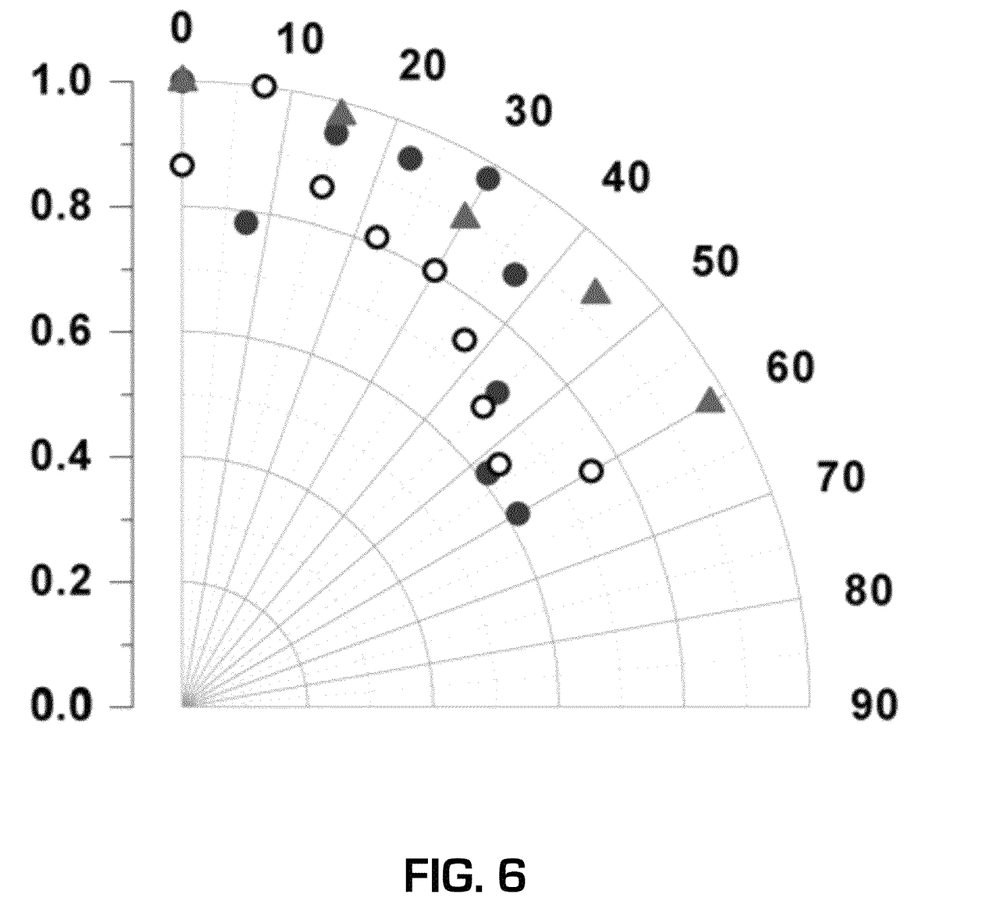
FIG. 6 shows a graph of the measured angular dependency of the PL spectra intensity of the quantum-structure lattice samples of FIGS. 3A and 3B.

FIG. 6 shows the measured angular dependency of 77K PL spectra intensity of the two QSL samples (Sample A and Sample C) whose PL spectra at 0° were displayed in graphs (a) and (c) shown in FIG. 3, respectively. The angular dependencies of the samples were measured by rotating the samples inside a cryostat. At each angle, the PL intensity of the samples was normalized with respect to an unprocessed quantum well sample. Due to the limit of allowed access angle of the cryostat, the angular dependency measurements were limited to a maximum angle of about 60°, beyond which the PL signals were too noisy to be included.

As shown in FIG. 6, for both QSL samples, the PL intensities (shown as the outlined and filled dots in the graph) do not maintain a constant value and drops off quickly at an angle of about ±30° and drops off quickly at an angle of about ±35°. In contrast, the PL intensity (not shown) of the unprocessed quantum well sample shows no angular dependency.

The collimated angular dependent spontaneous emission results are similar to those observed in 2D DFB polymer lasers excited well below lasing threshold. Nevertheless, the PL spectrum of the 2D DFB polymer laser shows a pair of closely spaced peaks rather than a single peak in the QSL array. In contrast, the QW sample shows no angular dependency (not shown). Similarly, the radiation pattern of a non-uniform site-controlled quantum dot (SCQD) array fabricated using the same NIL mask (100×100 $nm^2$ openings on a 200 nm rectangular pitch), which has a wide PL linewidth of ≥100 meV, shows no angular dependency. Due to the wide spread QD emission wavelengths of the SCQD array, the 2D DFB effect for a specific wavelength is greatly reduced. These results indicate that a uniform 2D QSL array may be essential for the 2D DFB effect.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A quantum well of an active region of a semiconductor device, comprising:
   a quantum structure lattice having a plurality of quantum structures, including at least a first quantum structure, a second quantum structure, and a third quantum structure, wherein the first quantum structure, the second quantum structure, and the third quantum structure are disposed noncollinearly, the quantum structure lattice further having lattice geometries that satisfies a Bragg condition, such that inter-quantum structure distance d between the first quantum structure and the second quantum structure within the quantum structure lattice and between the first quantum structure and the third quantum structure is each a positive integer multiple of a emission half wavelength $m\lambda_o/2n$, where m is a positive integer, $\lambda_o$ is a wavelength in free space of light emission from the quantum well, and n is a refractive index of a cladding material of the quantum well, wherein the first quantum structure is configured to emit photons that constructively interfere with photons emitted by the second quantum structure and with photons emitted by the third quantum structure.

2. The quantum well of claim 1, wherein the quantum structure lattice comprises a quantum box lattice.

3. The quantum well of claim 2, wherein the quantum box lattice comprises a two-dimensional array of quantum boxes.

4. The quantum well of claim 3, wherein the two-dimensional array of quantum boxes comprises a square quantum box pattern.

5. The quantum well of claim 1, wherein the quantum structure lattice comprises a quantum dot lattice.

6. The quantum well of claim 5, wherein the quantum dot lattice comprises a two-dimensional array of quantum dots.

7. The quantum well of claim 1, wherein a periodicity of active lattice elements within the quantum structure lattice is an integer multiplication of a half wavelength of an optical emission from each lattice element within the quantum structure lattice.

8. The quantum well of claim 1, wherein lattice elements within the quantum structure lattice are relatively uniform in size.

9. The quantum well of claim 1, wherein the quantum structure lattice has a relatively uniform nearest distance between lattice elements within the quantum structure lattice.

10. The quantum well of claim 1, where the quantum structure lattice has a photoluminescence peak that is shifted from an as-grown photoluminescence peak of an as-grown quantum well made of a same material as the quantum structure lattice.

11. The quantum well of claim 1, wherein the first quantum structure is further configured to emit the first photons based at least in part on a phonon absorption recombination process.

12. The quantum well of claim 1, wherein the plurality of quantum structures include one of: a plurality of quantum boxes and a plurality of quantum dots.

13. A method for forming a semiconductor device comprising:
    forming, within a quantum well of an active region of the semiconductor device, a quantum structure lattice having a plurality of quantum structures, including at least a first quantum structure, and a second quantum structure, and a third quantum structure, wherein the first quantum structure, the second quantum structure, and the third Quantum structure are disposed noncollinearly, and further having lattice geometries that satisfies a Bragg condition, such that inter-quantum structure distance d between the first quantum structure and the second quantum structure within the quantum structure lattice and between the first quantum structure and the third quantum structure is each a positive integer multiple of a emission half wavelength $m\lambda_o/2n$, where m is a positive integer, $\lambda_o$ is a wavelength in free space of light emission from the quantum well, and n is a refractive index of a cladding material of the quantum well, wherein the first quantum structure is configured to emit photons that constructively interfere with photons emitted by the second quantum structure and with photons emitted by the third quantum structure.

14. The method of claim 13, further wherein the quantum structure lattice comprises a quantum box lattice.

15. The method of claim 14, wherein the quantum box lattice comprises a two-dimensional array of quantum boxes.

16. The method of claim 13, wherein the quantum structure lattice comprises a quantum dot lattice.

17. The method of claim 16, wherein the quantum dot lattice comprises a two-dimensional array of quantum dots.

18. The method of claim 13, wherein a periodicity of active lattice elements within the quantum structure lattice is an integer multiplication of a half wavelength of an optical emission from each lattice element within the quantum structure lattice.

19. The method of claim 13, wherein lattice elements within the quantum structure lattice are relatively uniform in size.

20. The method of claim 13, wherein the quantum structure lattice has a relatively uniform nearest distance between lattice elements within the quantum structure lattice.

21. The method of claim 13, where the quantum structure lattice has a photoluminescence peak that is shifted from an as-grown photoluminescence peak of an as-grown quantum well made of a same material as the quantum structure lattice.

* * * * *